(12) United States Patent
Kim et al.

(10) Patent No.: US 9,651,731 B2
(45) Date of Patent: May 16, 2017

(54) LIGHT GUIDE PLATE, MANUFACTURING METHOD OF THE SAME AND DISPLAY DEVICE COMPRISING THE SAME

(71) Applicant: BOE TECHNOLOGY GROUP CO., LTD., Beijing (CN)

(72) Inventors: Heecheol Kim, Beijing (CN); Yan Wei, Beijing (CN); Chao Xu, Beijing (CN); Chunfang Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 369 days.

(21) Appl. No.: 14/364,843

(22) PCT Filed: Sep. 19, 2013

(86) PCT No.: PCT/CN2013/083851
§ 371 (c)(1),
(2) Date: Jun. 12, 2014

(87) PCT Pub. No.: WO2014/166211
PCT Pub. Date: Oct. 16, 2014

(65) Prior Publication Data
US 2015/0309244 A1    Oct. 29, 2015

(30) Foreign Application Priority Data
Apr. 7, 2013 (CN) .......................... 2013 1 0117205

(51) Int. Cl.
*G02B 6/00* (2006.01)
*F21V 8/00* (2006.01)
(Continued)

(52) U.S. Cl.
CPC ...... *G02B 6/0058* (2013.01); *B29D 11/00663* (2013.01); *G02B 1/11* (2013.01);
(Continued)

(58) Field of Classification Search
CPC ........ G03F 7/0005; G03F 7/20; G03F 7/2002; G02F 1/1336; G02F 1/133605;
(Continued)

(56) References Cited

U.S. PATENT DOCUMENTS

| | | | |
|---|---|---|---|
| 7,920,228 B2 | 4/2011 | Bae et al. | |
| 2001/0050848 A1* | 12/2001 | Asakawa | G02B 6/0028 362/627 |

(Continued)

FOREIGN PATENT DOCUMENTS

| | | |
|---|---|---|
| CN | 1482498 A | 3/2004 |
| CN | 1485657 A | 3/2004 |

(Continued)

OTHER PUBLICATIONS

Chinese Office Action of Chinese Application No. 201310117205.3 with English translation, mailed Jul. 3, 2014.

(Continued)

*Primary Examiner* — John A McPherson
(74) *Attorney, Agent, or Firm* — Collard & Roe, P.C.

(57) ABSTRACT

A manufacturing method of the light guide plates, a light guide plate made by the method and a double-side display device comprising the light guide plate. The manufacturing method of a light guide plate comprises: forming a plurality of alternating first grooves (101) and second grooves (102) on a surface of a transparent substrate (100); forming a first reflective layer (300) on a surface of the first groove (101); and forming a transparent protective layer (500) on the entire surface of the substrate. According to the present disclosure, a light guide plate is provided that can be used in the double-side display device.

20 Claims, 6 Drawing Sheets

(51) Int. Cl.
*G03F 7/20* (2006.01)
*G02B 1/11* (2015.01)
*G03F 7/00* (2006.01)
*B29D 11/00* (2006.01)

(52) U.S. Cl.
CPC ......... *G02B 6/0036* (2013.01); *G02B 6/0055* (2013.01); *G02B 6/0063* (2013.01); *G02B 6/0065* (2013.01); *G02B 6/0076* (2013.01); *G03F 7/0005* (2013.01); *G03F 7/2002* (2013.01)

(58) Field of Classification Search
CPC ... G02F 1/133606; G02F 2001/133607; G02F 1/133611; G02F 1/133615; G02F 1/133618; G02B 6/0036; G02B 6/0058; G02B 6/0063; G02B 6/0065; G02B 6/0076; G02B 1/11
USPC ......... 430/321; 349/62, 63, 65, 66; 362/618, 362/619, 623, 624, 625, 626, 627
See application file for complete search history.

(56) References Cited

U.S. PATENT DOCUMENTS

| | | | |
|---|---|---|---|
| 2004/0246412 A1* | 12/2004 | Kim | G02F 1/133555 349/113 |
| 2005/0052884 A1 | 3/2005 | Liu | |
| 2005/0141063 A1 | 6/2005 | Nishino et al. | |
| 2005/0231982 A1* | 10/2005 | Kajiura | G02B 6/0055 362/625 |
| 2010/0302218 A1 | 12/2010 | Bita et al. | |
| 2012/0120081 A1* | 5/2012 | Bita | G02B 6/005 345/520 |
| 2013/0094243 A1 | 4/2013 | Wu et al. | |

FOREIGN PATENT DOCUMENTS

| | | |
|---|---|---|
| CN | 100531306 C | 8/2009 |
| CN | 102425763 A | 4/2012 |
| CN | 103197370 A | 7/2013 |
| JP | 2011-65049 A | 3/2011 |

OTHER PUBLICATIONS

English translation of the International Preliminary Report on Patentability and Written Opinion of the International Searching Authority of PCT/CN2013/083851, issued Oct. 13, 2015.
Second Chinese Office Action of Chinese Application No. 201310117205.3 with English translation, mailed Dec. 3, 2014.
English Translation of the International Search Report of PCT/CN2013/083851, mailed Jan. 9, 2014.
International Search Report, International Preliminary Report on Patentability and Written Opinion of the International Searching Authority of PCT/CN2013/083851 in Chinese, mailed Jan. 9, 2014.
European Search Report in EP 13861500.0 dated Aug. 25, 2016.

* cited by examiner

LIGHT GUIDE PLATE, MANUFACTURING METHOD OF THE SAME AND DISPLAY DEVICE COMPRISING THE SAME

CROSS REFERENCE TO RELATED APPLICATIONS

This application is the National Stage of PCT/CN2013/083851 filed on Sep. 19, 2013, which claims priority under 35 U.S.C. §119 of Chinese Application No. 201310117205.3 filed on Apr. 7, 2013, the disclosure of which is incorporated by reference.

FIELD

The present disclosure relates to a light guide plate and a manufacturing method of the same, and a display device comprising the same.

BACKGROUND

The backlight module as one of the important components in a liquid crystal display provides sufficient brightness and uniform distribution to enable the liquid crystal display present proper image, since liquid crystals do not emit lights on its own. At present, the display techniques for the liquid crystal display have already matured, in particular the design of the backlight module has made a great development. The backlight module can also be used to provide illumination for display devices such as digital photo frame, e-paper, cell phone and so on in addition to liquid crystal display device such as liquid crystal monitor, liquid crystal television and so on.

The backlight modules are categorized into a direct type backlight module and a side type backlight module according to the position of the light source. In the direct type backlight module, the light sources are placed below light emitting surface of the light source. The lights from the light sources travel through a certain distance and are diffused and blended by a diffuser plate, then the lights are emitted, acting as a surface light source. In the side type backlight module, the light sources are generally arranged on at least one of the side surfaces of the light guide plate. Lights are introduced into a light guide plate from the side surface and are subjected to a total reflection and continue to travel forward within the light guide plate. The lights are emitted out of the light guide plate by breaking the total reflection condition at the light emitting surface of the light guide plate. Hence, the configuration of the light guide plate has a primary influence on the light emitting effect of the backlight module.

FIG. 1 is a structural schematic view showing a conventional light guide plate. The light guide plate comprises a light guide plate substrate 9. The light guide plate substrate 9 comprises an incident surface 1 for receiving beams, a lower surface 3 jointed with the incident surface 1, an emitting surface 2 jointed with the incident surface 1 and opposing the lower surface 3, a side surface 4 opposing to the incident surface 1, and other two side surfaces opposing to each other. In order to break the total reflection of lights within the light guide plate, optical grid points 5 are provided at the lower surface 3. The lights entering the light guide plate are subjected to the total reflection on the inner sides of the light guide plate many times, and spread into the entire interior of the light guide plate. When the lights are diffused on the optical grid points 5 and emitted out of the light guide plate through the emitting surface 2 thereof (the lower surface 3 does not transmit lights). By adjusting the density of the optical grid points 5, the light guide plate can have an uniform light distribution across the entire emitting surface. A light source 6 is provided on the outer side of the incident surface 1. A reflective cover 7 is provided on outer side of the light source 6 and the side surface 4 and other side surfaces are formed as reflective by disposing reflective sheets. The lights emitted by the light source 6 enter the light guide plate through the incident surface 1, and emit out from the emitting surface 2 by the reflection of the lower surface 3 and side surface 4.

It is noted that the above light source can be positioned on at least one side surfaces of the light guide plate. The light source herein is only provided at one side surface of the light guide plate and for convenience of description. The above light guide plate in the backlight module used in a single side display device can only emit lights from a single emitting surface, and is unable to meet the requirements of a double-side display device.

SUMMARY

The present disclosure provides a light guide plate that can be used in a double-side display device.

According to one aspect, the present disclosure provides a manufacturing method of a light guide plate comprising steps of: forming a plurality of alternating first and second grooves on a surface of a transparent substrate; forming a first reflective layer on a surface of the first groove; and forming a transparent protective layer on the entire surface of the substrate.

In one example, the step of forming the first reflective layer on the surface of the first groove further comprises: forming a photoresist on the surface of the substrate formed with the first groove and the second groove; exposing and developing the photoresist using a mask so as to remove the photoresist at the region corresponding to the first groove; forming a reflective material film on the above configuration, and stripping off the remaining photoresist and keeping only the first reflective layer on the surface of the first groove.

In one example, after the step of forming the transparent protective layer on the entire surface of the substrate, the method further comprises a step of forming a first antireflection layer on the surface of the protective layer at the regions corresponding to the first groove.

In one example, between the step of forming the reflective material film and the step of stripping off the remaining photoresist, the method further comprises a step of forming an antireflection material film on the surface of the reflective material film.

In one example, the first groove has a depth less than that of the second groove, and the method further comprises a step of forming second reflective layer only on a side surface of the second groove at the same time during the step of forming the first reflective layer on the surface of the first groove.

In one example, the step of forming the second reflective layer only on the side surface of the second groove at the same time during the step of forming the first reflective layer on the surface of the first groove comprises: forming a photoresist on the surfaces on the first and second grooves and planarizing the photoresist; performing an ashing process on the photoresist so that the photoresist at the bottom of the second groove remains and the remaining photoresist has a thickness less than the depth of the second groove; and forming a reflective material film on the surface of the resultant configuration and stripping off the remaining photoresist, so that the surface of the first groove is formed with the first reflective layer and only the side surface of the second groove is formed with the second reflective layer.

In one example, after the step of stripping off the remaining photoresist, the method further comprises removing the reflective material film at regions other than the regions corresponding to the side surface of the second groove and the first groove.

In one example, after the step of forming the transparent protective layer on the entire surface of the substrate, the method further comprises a step of forming a first antireflection layer on the surface of the protective layer at a region corresponding to the first groove and forming a second antireflection layer on the surface of the protective layer at a region corresponding to the side surface of the second groove.

In one example, between the step of forming the reflective material film and the step of stripping off the remaining photoresist, the method further comprises a step of forming a non-reflective material film on a surface of the reflective material film.

In one example, after the steps of forming the first reflective layer and the non-reflective layer on the surface of the first groove and forming the second reflective layer and the non-reflective layer on the side surface of the second groove, the method further comprises a step of removing the reflective material film and the non-reflective material film at regions other than the regions corresponding to the side surface of the second groove and the first groove.

In one example, the first groove has a depth of 0.5 µm to 3 µm, and the second groove has a depth of 3 µm to 50 µm.

In one example, the second groove has a sectional shape of a trapezoid, and the angles between both side lines and the bottom line of the trapezoid are between 20° to 60°, respectively.

In one example, the second groove has a shape of hexahedron, and the hexahedron has an upper base surface which is a bottom surface of the second groove, a lower base surface parallel to the upper base surface, and the remaining four side surfaces, the lower base surface has an area greater than that of the upper base surface.

In one example, the method further comprises providing a light source on the side surface of the substrate.

Another aspect of the present disclosure provides a light guide plate made by the above manufacturing method.

Another aspect of the present disclosure also provides a double-side display device comprising a display panel; and two light guide plates as mentioned above provided at either side of the display panel and facing away from each other.

According to the manufacturing method of a light guide plate of the present disclosure, the first and second grooves are formed on the surface of a transparent substrate, and a reflective layer is formed at the bottom of the first groove for reflecting lights. The light guide plate made by this method is formed with alternating transmission protrusions (corresponding to the second grooves) for entering the display panel from one side of the display device and reflective protrusions (corresponding to the first grooves) for reflecting the lights passing through the first groove and preventing transmission of lights through the opposing other side of the display device which otherwise would interfere with the display at this side, thereby achieving a double-side display device capable of display at both sides respectively.

BRIEF DESCRIPTION OF THE DRAWINGS

In order to explain the technical solutions of the present disclosure or the prior art more clearly, a brief introduction of the drawings for the description of the technical solutions provided by the present disclosure or prior art will be described as following, and obviously, the drawings in the following description involves only part of the specific embodiments of the technical solution of the present disclosure, the skilled person in the art can also obtain other drawings based on these drawings without any creative endeavor.

DETAILED DESCRIPTION OF THE PREFERRED EMBODIMENTS

In the following, a clear and full description of the technical solutions of the embodiments of the present disclosure will be made in conjunction with the drawings of the embodiments of the present disclosure, and obviously, the described embodiments are only part of the embodiments of the present disclosure, rather than all of the embodiments. Based on the embodiments of the present disclosure, all the other embodiments obtained by the ordinary skilled in the art without any creative endeavors fall into the protective scope of the present disclosure.

Unless defined otherwise, the technical terms or scientific terminology being used should take the meaning usually understood by the ordinary skilled in this art of present disclosure. The "first", "second" and similar words used in the description and claims of the present application does not denote any sequence, quantity or importance, but are used for distinguishing different components. Also, "one" or "a(an)" and the similar words do not mean quantitative restriction, but refer to the presence of at least one. The "connecting" or "jointing" and the similar words are not limited to physical or mechanical connections, but can comprise electrical connection, no matter directly or indirectly. The words "upper", "lower", "left", "right" and the like are only used to denote a relative positional relationship, and when the described object is changed in its absolute position, this relative positional relationship is also changed accordingly.

First Embodiment

FIGS. 2-5 are schematic section views of a light guide plate in each step of a manufacturing method of the light guide plate according to the first embodiment of the present disclosure. The manufacturing method of a light guide plate of the present embodiment comprises following steps.

Figure 1:
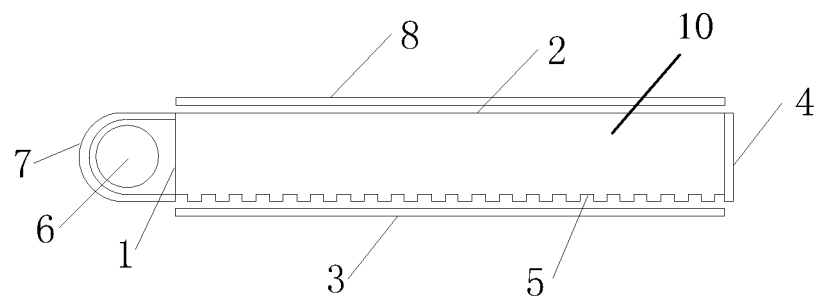
FIG. 1 is a structural schematic view of a conventional light guide plate.
Figure 2:
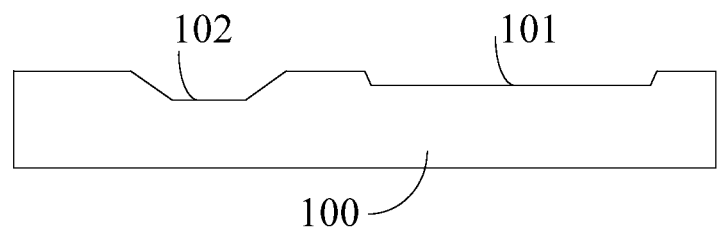
FIGS. 2-5 are schematic section views of a light guide plate in each step of a manufacturing method of the light guide plate according to a first embodiment of the present disclosure.

Step 1, as shown in FIG. 2, a plurality of alternating first grooves 101 and second grooves 102 are formed on a surface of the transparent substrate 100, for example, a glass, a quartz material and the like. The grooves can be formed by firstly applying a photoresist, exposing and developing the regions to be etched, then etching with solutions such as a hydrofluoric acid.

Figure 3:
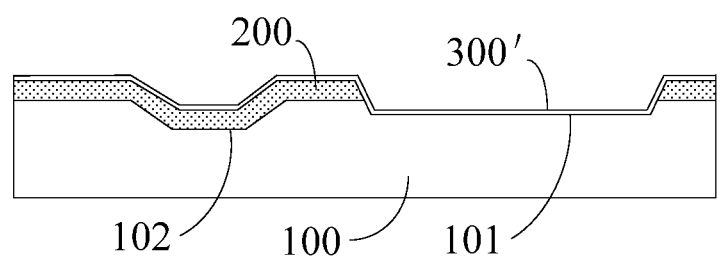

Step 2, a pattern comprising a first reflective layer 300 is formed on the surface of the first grooves 101, as shown in FIG. 3. The step comprises following steps in particular.

Figure 4:
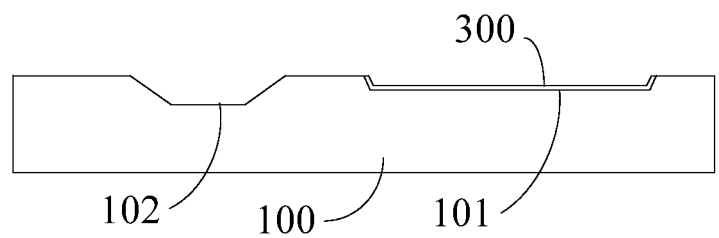

A photoresist 200 is formed on the surface of the first grooves 101 and the second groove 102. The photoresist 200 is exposed and developed using a mask so as to remove the photoresist 200 at the regions corresponding to the first groove 101. Then a reflective material film 300' is formed on the entire surface of the transparent substrate 100. The reflective material can be a metal film. As shown in FIG. 4, the remaining photoresist 200 is stripped off so that only the surface of the first groove 101 is formed with the first reflective layer 300.

Figure 5:
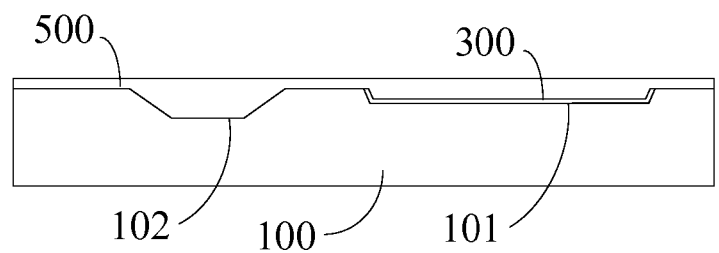

Step 3, as shown in FIG. 5, a transparent protective layer 500 is formed on the surface of the configuration shown in FIG. 4, thereby a light guide plate is formed. Herein, the protective layer 500 can be formed by a method such as coating, sputtering and so on.

Figure 6:
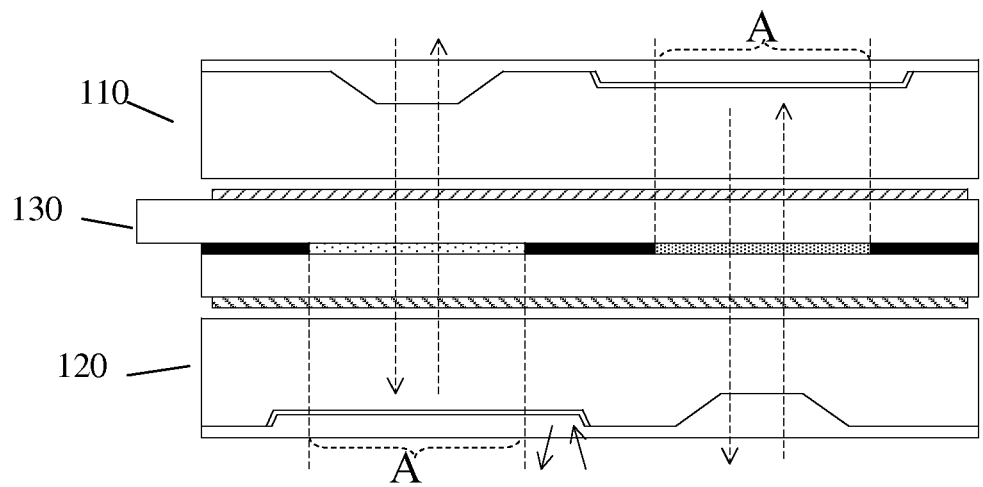
FIG. 6 is a schematic section view of a double-side display device comprising the light guide plate shown in FIG. 5 with the light path illustrated.

As shown in FIG. 6, a double-side display device comprising a light guide plate according to the present embodiment as shown in FIG. 5 includes two light guide plates 110 and 120 according to the present embodiment and one display panel 130, aid the two light guide plates 110 and 120 are located on either side of the display panel 130 and face away from each other. The display panel 130 is arranged between the two light guide plates 110 and 120. Within each light guide plate, the first groove 101 formed with the first reflective layer 300 becomes a reflective part, and the second groove 102 becomes a transmissive part for transmitting external lights. The transmissive part corresponds to the region of one or more pixel electrodes on a corresponding side of the display panel. Hence, the display device does not need an internal light source, and can be set up as a double-side display device of complete reflection type. As indicated by the light path shown with the dotted arrow in FIG. 6, the reflective grooves can not only reflect lights, but also block the lights transmitted from another side when watching on one opposing side, thereby the effect of double-side display is achieved.

Second Embodiment

Figure 7:
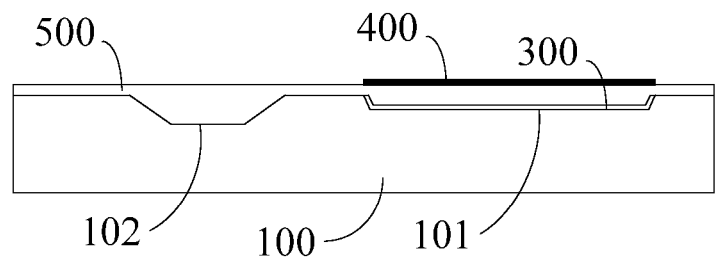
FIG. 7 is a schematic section view of the light guide plate made by the manufacturing method of a light guide plate according to a second embodiment of the present disclosure.

FIG. 7 is a schematic section view of the light guide plate made by the manufacturing method of a light guide plate according to the second embodiment of the present disclosure. As shown in FIG. 7, in the present embodiment, on the configuration of the embodiment 1 shown in FIG. 5, a first antireflection layer 400 is formed on the surface of the protective layer 500 at regions corresponding to the first groove 101 so as to prevent reflecting of the external lights. For example, after step 3 of the embodiment 1, the first antireflection layer 400 is formed on the surface of the protective layer 500 at regions corresponding to the first groove by a patterning process (comprising photoresist coating, exposing, developing, etching and stripping off the photoresist and the like).

Since the surface of the first reflective layer 300 is covered with a layer of the first antireflection layer 400, thus preventing reflections when the external lights impinge onto the first reflective layer 300, as shown by the arrow in FIG. 6, thereby improving the display effect of the double-side display having the light guide plate.

Third Embodiment

The steps 1 and 3 in the manufacturing method of a light guide plate in the present embodiment are the same as those in the first embodiment, but the step 2 is different. In the present embodiment, the step 2 comprises following steps in particular.

Figure 8:
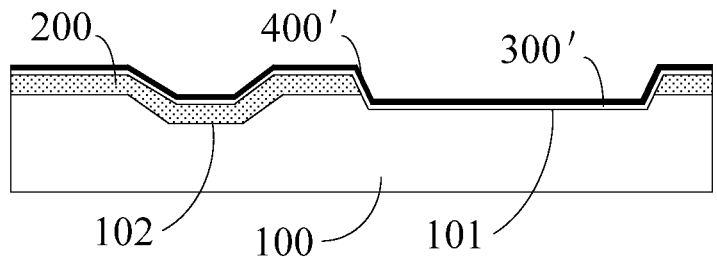
FIGS. 8-10 are schematic section views of a light guide plate in each step of a manufacturing method of the light guide plate according to a third embodiment of the present disclosure.
Figure 9:
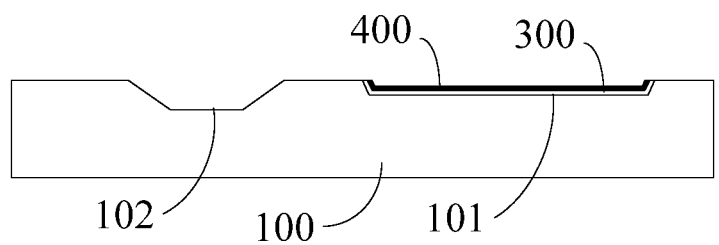
Figure 10:
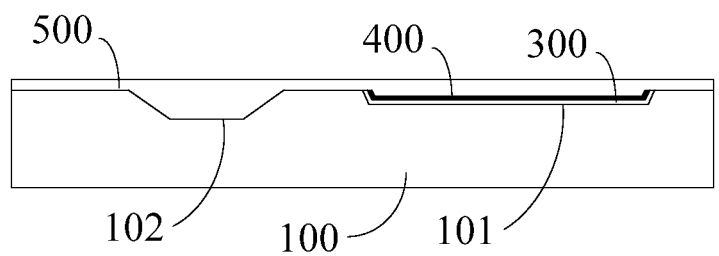

As shown in FIG. 8, on the configuration after step 1 of the first embodiment, that is, the configuration shown in FIG. 3, an antireflection material film 400' is formed on the surface of the reflective material film 300, and the antireflection material film 400' can be made with the same material as that of the black matrices in the display panel. As shown in FIG. 9, the remaining photoresist is stripped off, so that the surface of the first groove is formed successively with the first reflective layer 300 and the first antireflection layer 400. The step 3 of the first embodiment is performed on the configuration of FIG. 9, that is, the protective layer 500 is formed, thereby forming the light guide plate as shown in FIG. 10.

Since the first reflective layer 300 and the first antireflection layer 400 can be formed successively using a single mask process, there is no separate mask process for forming the antireflection layer 400 in comparison with the second embodiment, thus saving manufacture processes and cost, and at the same time preventing reflection of the external lights which affects watching, therefore the display quality is also improved.

Fourth Embodiment

The manufacturing method of a light guide plate according to the present embodiment comprises following steps.

Step 1, the step 1 of the present embodiment is similar as that of the first embodiment. As shown in FIG. 2, a surface of the transparent substrate 100 of for example a glass, quartz material and so on is formed with a plurality of alternating first and second grooves 101 and 102. Since a reflective layer is to be formed on the side surface of the second groove 102, the side surface of the second groove 102 should be as great as possible, thus the depth of the second groove 102 is greater than the depth of the first groove 101. The first groove 101 has a depth of for example 0.5 μm~3 μm, and the second groove 102 has a depth of for example 3 μm-50 μm, which is made greater than the depth of the first groove 101 as much as possible in order to facilitate the etching. Preferably, the second groove 102 has a depth between 10 μm and 50 μm.

For a better reflection of lights from the internal lights on the side surfaces into the display panel, the second groove 102 has a trapezoid sectional shape, and the angles between the two side lines and the bottom line are 20°~60°, respectively. In order to make the reflected lights incident into the display panel uniformly, the trapezoid is preferably an isosceles trapezoid. For instance, the second groove 102 can be in a shape of round mesa or a hexahedron. The second groove 102 has a hexahedron shape, the lower surface of the second groove 102 is the upper base surface of the hexahedron, and the surface parallel to the upper base surface is the lower base surface, and the other four surfaces are the side surfaces. The lower base surface has an area greater than that of the upper base surface. When the angles between the side surfaces and lower base surface are equal, the cross section shape of the hexahedron is an isosceles trapezoid.

Step 2, the surface of the first groove 101 is formed with a first reflective layer, and at the same time the side surfaces of the second groove 102 are formed with a second reflective layer. This step comprises following steps in particular.

Figure 11:
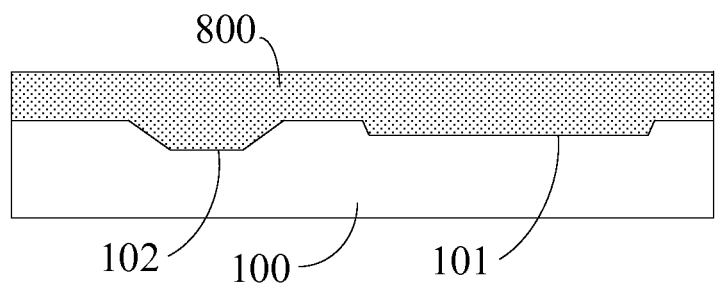
FIGS. 11-15 are schematic section views of a light guide plate in each step of a manufacturing method of the light guide plate according to a fourth embodiment of the present disclosure.
Figure 12:
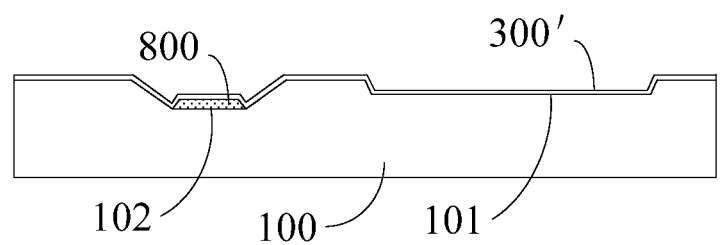
Figure 13:
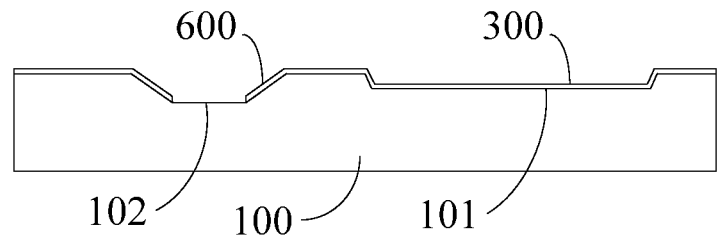

As shown in FIG. 11, a photoresist 800 is formed on the surface of the light guide plate comprising the first and second grooves 101 and 102, and planarized. Then, the photoresist 800 is ashed so as to keep the photoresist 800 at the bottom of the second groove 102, such that the remaining photoresist 800 has a thickness less than the depth of the second groove 102. Then, a reflective material film 300' is formed on the resultant configuration, as shown in FIG. 12. The remaining photoresist 800 is stripped off so as to remove the reflective material film 300' at the bottom of the second groove 102, such that the surface of the first groove 101 is formed with a first reflective layer 300, the side surfaces of the second groove 102 are formed with a second reflective layer 600, as shown in FIG. 13.

Figure 14:
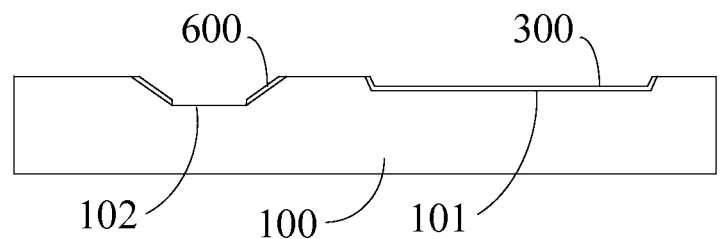

Alternatively, for transmitting more lights through the light guide plate, the reflective material film 300' at the regions other than the regions corresponding to the first groove 101 and the side surfaces of the second groove 102 can be removed, and only the first reflective layer 300 at the side surfaces and bottom of the first groove 101 as well as the second reflective layer 600 at the side surfaces of the second groove 102 remain, as shown in FIG. 14.

Figure 15:
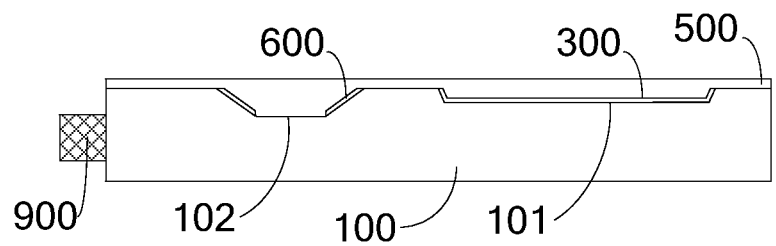

Step 3, as shown in FIG. 15, a transparent protective layer 500 is formed on the resultant configuration, thus forming the light guide plate. Here, the protective layer 500 can be formed by a method such as coating, sputtering and so on. Since internal light source is needed, light source 900 such as a LED light source is also formed at the side surfaces of the transparent substrate 100.

Figure 16:
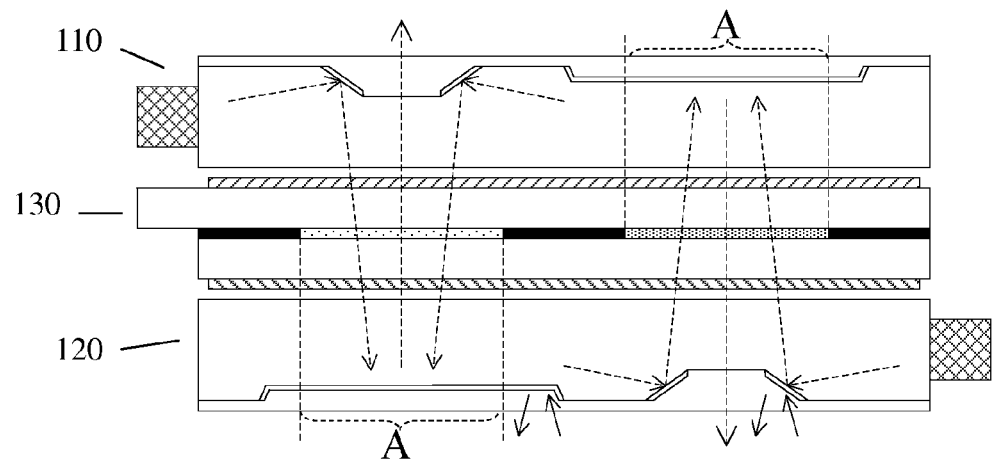
FIG. 16 is a schematic section view of a double-side display device comprising the light guide plate shown in FIG. 15 with the light path illustrated.

FIG. 16 illustrates a double-side display device comprising the light guide plate according to the present embodiment. A light path is also shown in FIG. 16 with dotted arrows. As shown in FIG. 16, the double-side display device comprises the light guide plates 210, 220 shown in FIG. 15 and a display panel 230. The two light guide plates 210, 220 are provided at either side of the display panel 230 respectively and facing away from each other. In the light guide plates 210, 220 of the present embodiment, the side surfaces of the second groove 102 are formed with a second reflective layer 600 for reflecting the lights from the light source 900 to the display panel 230.

The light guide plate of the present embodiment has internal light sources, thus enabling proper display even in cases where external light sources are insufficient or no external light sources are provided. An external light source intensity sensor can be provided in the backlight driver circuit, which, based on whether the detected light intensity from the external light source is strong or weak, the internal light sources can be adjusted to provide either no lights or supplemental lights, or serve as the sole light source.

Fifth Embodiment

Figure 17:
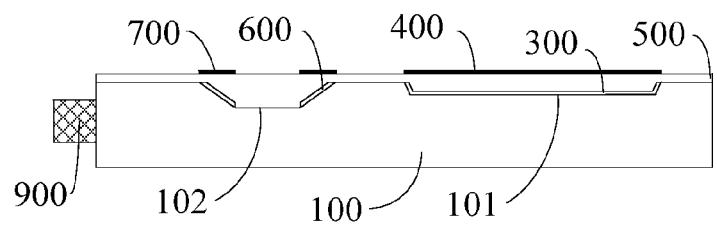
FIG. 17 is a schematic section view of the light guide plate made by the manufacturing method of a light guide plate according to a fifth embodiment of the present disclosure.

As shown in FIG. 17, in the present embodiment, a first antireflection layer 400 is formed at regions of the surface of the protective layer 500 corresponding to the first groove 101, and a second antireflection layer 700 is formed at regions corresponding to the side surfaces of the second groove 102.

The first and second antireflection layers 400 and 700 are used to prevent the reflection of external lights. Specifically, after steps 1 to 3, the first antireflection layer 400 is formed at regions of the surface of the protective layer 500 corresponding to the first groove 101, and the second antireflection layer 700 is formed at regions corresponding to the side surfaces of the second groove 102 by a patterning processes.

Since the surface of the first reflective layer 300 is covered with a layer of the first antireflection layer 400, the surface of the second reflective layer 600 is covered with a layer of the second antireflection layer 700, the reflection of the external light as shown in FIG. 16 with the solid arrows would not occur, thus improving the double-side display quality.

Sixth Embodiment

The manufacturing method of a light guide plate according to the present embodiment is same as the fourth embodiment 4 in terms of steps 1 and 3, but is different in step 2. In the present embodiment, step 2 comprises the following steps in particular.

Figure 18:
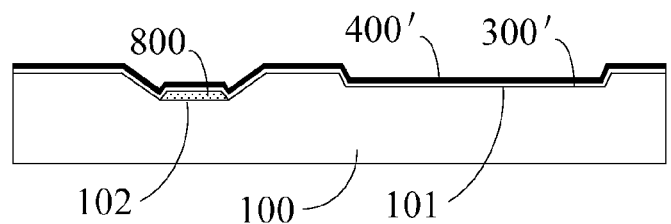
FIGS. 18-21 are schematic section views of a light guide plate in each step of a manufacturing method of the light guide plate according to a sixth embodiment of the present disclosure.
Figure 19:
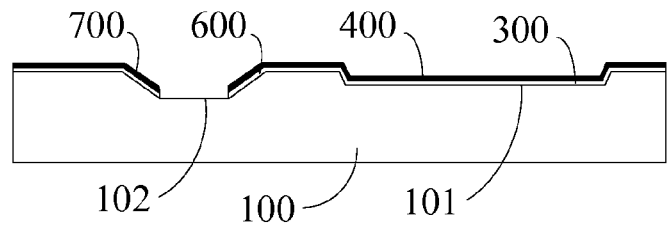

An antireflection material film 400' is formed on the configuration shown in FIG. 11. That is, an antireflection material film 400' is formed on the surface of the reflective material film 300', as shown in FIG. 18. The antireflection material film 400' can be made with the same material as that of the black matrices in the display panel. As shown in FIG. 19, the remaining photoresist 800 is stripped off, so as to form the first and second reflective layers 300 and 400 successively on the lower surface and side surface of the first groove 101, and form the second reflective layer 600 and the second antireflection layer 700 only on the side surfaces of the second groove 102.

Figure 20:
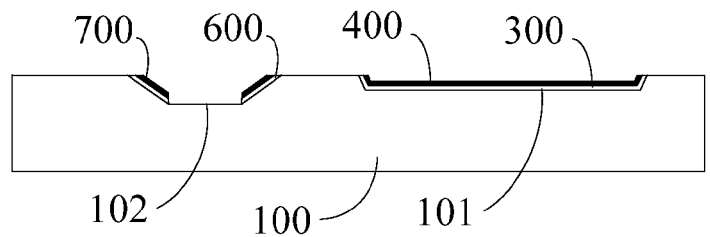

Alternatively, for transmitting more lights through the light guide plate, the reflective material film and the antireflection material film at the regions other than the regions of the substrate 100 corresponding to the first groove 101 and the side surfaces of the second groove 102 can be removed, and only the first reflective layer 300 and the first antireflection layer 400 at the side surfaces and bottom of the first groove 101 as well as the second reflective layer 600 and the second antireflection layer 700 at the side surfaces of the second groove 102 remain, as shown in FIG. 20.

Figure 21:
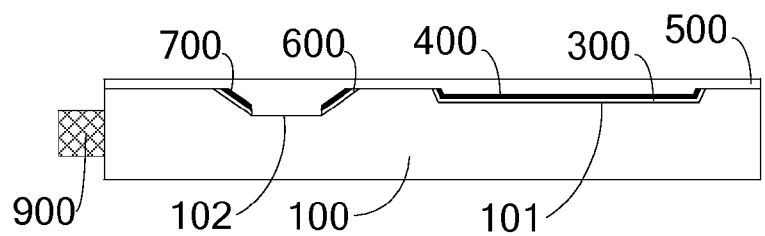

Step 3, a transparent protective layer 500 is formed on the resultant configuration, and a light source 900 can be mounted for example at the side surface of the light guide plate, as shown in FIG. 21.

Since the first reflective layer 300, the first antireflection layer 400, the second reflective layer 600 and the second antireflection layer 700 are formed in a single mask process, no additional mask processes are needed, thus saving the manufacture processes and cost, and at the same time preventing the reflection of the external lights which might affect watching, such that the display quality is also improved.

Figure 22:
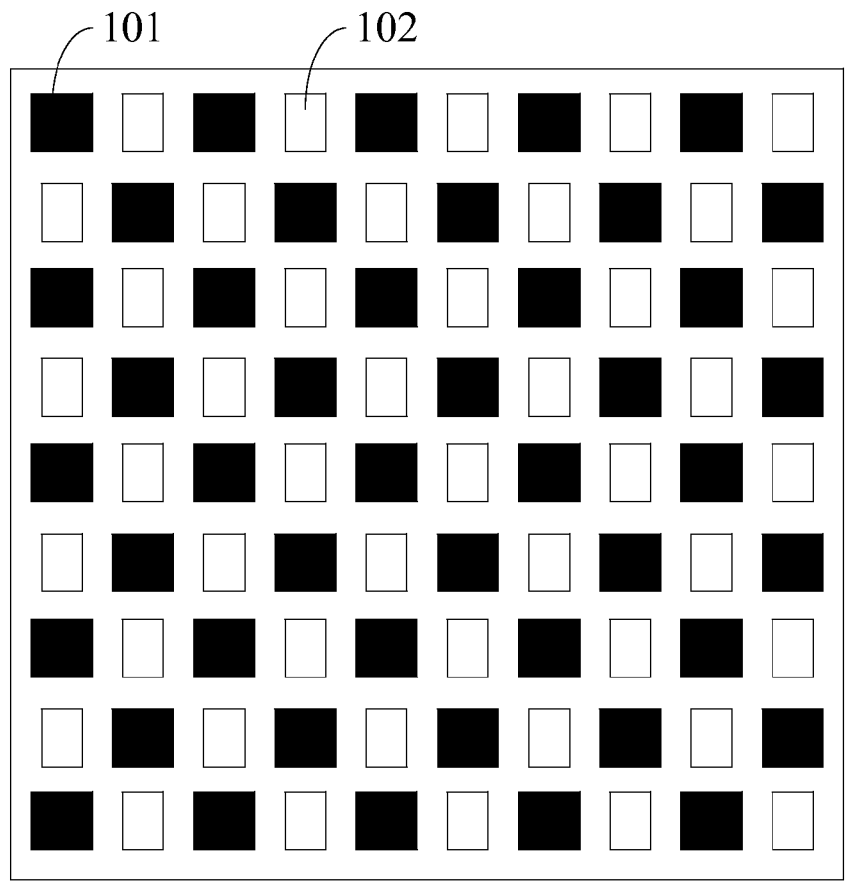
FIG. 22 is a schematic plan view of the light guide plate according to an embodiment of the present disclosure.

In the above embodiments; the plurality of alternating first and second grooves 101 and 102 formed on the transparent substrate 100 can be strip-like grooves, and preferably block-like grooves, as shown in the plan view of FIG. 22. As shown in FIG. 22, the first groove 101 indicated by the black color is formed with an antireflection layer, and the second groove 102 is formed with no antireflection layer.

The above embodiments are used only for explaining the examples of present disclosure, but not limiting the examples of present disclosure, the skilled ones in related prior art can make various modifications and variations without departing from the spirit and scope of the examples of present disclosure, therefore all equivalent technical solutions fall into the scope of the examples of present disclosure, and the patent protective scope of the examples of present disclosure should be defined by claims.

What is claimed is:

1. A manufacturing method of a light guide plate, comprising steps of:
    forming a plurality of alternating first and second grooves on a surface of a transparent substrate;
    forming a first reflective layer on a surface of the first groove; and
    forming a transparent protective layer on the entire surface of the substrate;
    wherein the first groove has a depth less than that of the second groove.

2. The manufacturing method of a light guide plate according to claim 1, wherein the step of forming the first reflective layer on the surface of the first groove further comprises:
    forming a photoresist on the surface of the substrate formed with the first groove and the second groove;
    exposing and developing the photoresist using a mask so as to remove the photoresist at the region corresponding to the first groove;
    forming a reflective material film on the above configuration, and
    stripping off the remaining photoresist and keeping only the first reflective layer on the surface of the first groove.

3. The manufacturing method of a light guide plate according to claim 2, wherein after the step of forming the transparent protective layer on the entire surface of the substrate, the method further comprises a step of forming a first antireflection layer on the surface of the protective layer at the regions corresponding to the first groove.

4. The manufacturing method of a light guide plate according to claim 2, wherein between the step of forming the reflective material film and the step of stripping off the remaining photoresist, the method further comprises a step of forming an antireflection material film on the surface of the reflective material film.

5. The manufacturing method of a light guide plate according to claim 1, further comprising a step of forming a second reflective layer only on a side surface of the second groove at the same time during the step of forming the first reflective layer on the surface of the first groove.

6. The manufacturing method of a light guide plate according to claim 5, wherein
    the step of forming the second reflective layer only on the side surface of the second groove at the same time during the step of forming the first reflective layer on the surface of the first groove comprises:
    forming a photoresist on the surfaces on the first and second grooves and planarizing the photoresist;
    performing an ashing process on the photoresist so that the photoresist at the bottom of the second groove remains and the remaining photoresist has a thickness less than the depth of the second groove; and
    forming a reflective material film on the surface of the resultant configuration and stripping off the remaining photoresist, so that the surface of the first groove is formed with the first reflective layer and only the side surface of the second groove is formed with the second reflective layer.

7. The manufacturing method of a light guide plate according to claim 6, wherein
    after the step of stripping off the remaining photoresist, the method further comprises removing the reflective material film at regions other than the regions corresponding to the side surface of the second groove and the first groove.

8. The manufacturing method of a light guide plate according to claim 6, wherein between the step of forming the reflective material film and the step of stripping off the remaining photoresist, the method further comprises a step of forming a non-reflective material film on a surface of the reflective material film.

9. The manufacturing method of a light guide plate according to claim 8, wherein after the steps of forming the first reflective layer and the non-reflective layer on the surface of the first groove and forming the second reflective layer and the non-reflective layer on the side surface of the second groove, the method further comprises a step of removing the reflective material film and the non-reflective material film at regions other than the regions corresponding to the side surface of the second groove and the first groove.

10. The manufacturing method of a light guide plate according to claim 5, wherein after the step of forming the transparent protective layer on the entire surface of the substrate, the method further comprises a step of forming a first antireflection layer on the surface of the protective layer at a region corresponding to the first groove and forming a second antireflection layer on the surface of the protective layer at a region corresponding to the side surface of the second groove.

11. The manufacturing method of a light guide plate according to claim 5, wherein the first groove has a depth of 0.5 µm to 3 µm, and the second groove has a depth of 3 µm to 50 µm.

12. The manufacturing method of a light guide plate according to claim 1, wherein the second groove has a sectional shape of a trapezoid, and the angles between both side lines and the bottom line of the trapezoid are between 20° to 60°, respectively.

13. The manufacturing method of a light guide plate according to claim 12, wherein the second groove has a shape of hexahedron, and the hexahedron has an upper base surface which is a bottom surface of the second groove, a lower base surface parallel to the upper base surface, and the remaining four side surfaces, the lower base surface has an area greater than that of the upper base surface.

14. The manufacturing method of a light guide plate according to claim 1, wherein the method further comprises providing a light source on the side surface of the substrate.

15. A light guide plate, comprising:
    a transparent substrate;
    a plurality of alternating first and second grooves on a surface of the transparent substrate;
    a first reflective layer on a surface of the first groove; and
    a transparent protective layer on the entire surface of the substrate;
    wherein the first groove has a depth less than that of the second groove.

16. The light guide plate according to claim 15, further comprises a first antireflection layer on the surface of the protective layer at the regions corresponding to the first groove.

17. The light guide plate according to claim 15, further comprising a second reflective layer only on a side surface of the second groove.

18. The light guide plate according to claim 15, wherein the first groove has a depth of 0.5 µm to 3 µm, and the second groove has a depth of 3 µm to 50 µm.

19. The light guide plate according to claim 15, wherein the second groove has a sectional shape of a trapezoid, and the angles between both side lines and the bottom line of the trapezoid are between 20° to 60°, respectively.

20. A double-side display device, comprising:

a display panel; and two light guide plates provided at either side of the display panel respectively and facing away from each other, each light guide plate comprises:

a transparent substrate;

a plurality of alternating first and second grooves on a surface of the transparent substrate;

a first reflective layer on a surface of the first groove; and a transparent protective layer on the entire surface of the substrate;

wherein the first groove has a depth less than that of the second groove.

* * * * *